United States Patent
Ueda

(10) Patent No.: US 11,923,228 B2
(45) Date of Patent: Mar. 5, 2024

(54) STAGE AND PLASMA PROCESSING APPARATUS

(71) Applicant: Tokyo Electron Limited, Tokyo (JP)

(72) Inventor: Takehiro Ueda, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 461 days.

(21) Appl. No.: 17/183,625

(22) Filed: Feb. 24, 2021

(65) Prior Publication Data
US 2021/0280449 A1 Sep. 9, 2021

(30) Foreign Application Priority Data
Mar. 9, 2020 (JP) ................... 2020-039924

(51) Int. Cl.
*H01L 21/683* (2006.01)
*H01J 37/32* (2006.01)

(52) U.S. Cl.
CPC .... *H01L 21/6833* (2013.01); *H01J 37/32082* (2013.01); *H01J 37/3244* (2013.01); *H01J 37/32642* (2013.01); *H01J 37/32715* (2013.01)

(58) Field of Classification Search
CPC .......... H01L 21/6833; H01L 21/67109; H01L 21/6831; H01L 21/68785; H01J 37/32082; H01J 37/3244; H01J 37/32642; H01J 37/32715
See application file for complete search history.

(56) References Cited

U.S. PATENT DOCUMENTS

| 2009/0230636 A1* | 9/2009 | Goto | H01L 21/6831 279/128 |
| 2020/0294838 A1* | 9/2020 | Yoshikawa | H01J 37/32724 |
| 2022/0020563 A1* | 1/2022 | Noguchi | B05B 1/005 |

FOREIGN PATENT DOCUMENTS

JP 2018-056372 4/2018

* cited by examiner

*Primary Examiner* — Renan Luque
(74) *Attorney, Agent, or Firm* — IPUSA, PLLC

(57) ABSTRACT

A stage to be disposed in a chamber of a plasma processing apparatus is provided. The stage includes a chuck with a mounting portion for a substrate and a first hole through the mounting portion. The stage includes a base disposed beneath the chuck, the base including a second hole through the base, and the second hole communicating with the first hole. The base includes a first cylindrical liner disposed in the second hole, the first cylindrical liner having a relative permittivity of 5 or less.

19 Claims, 7 Drawing Sheets

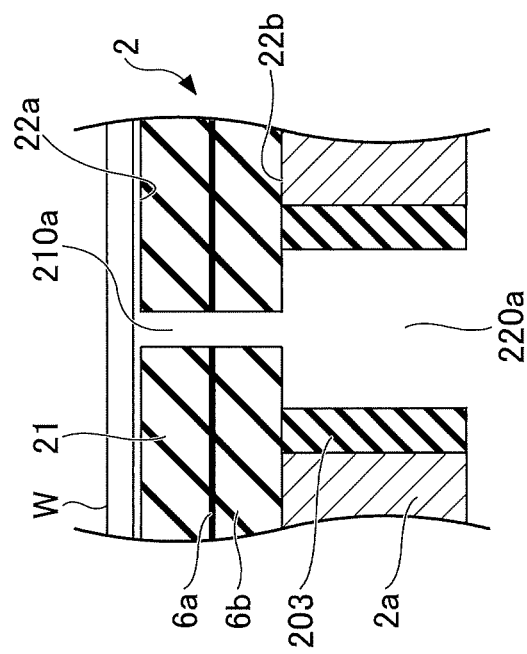
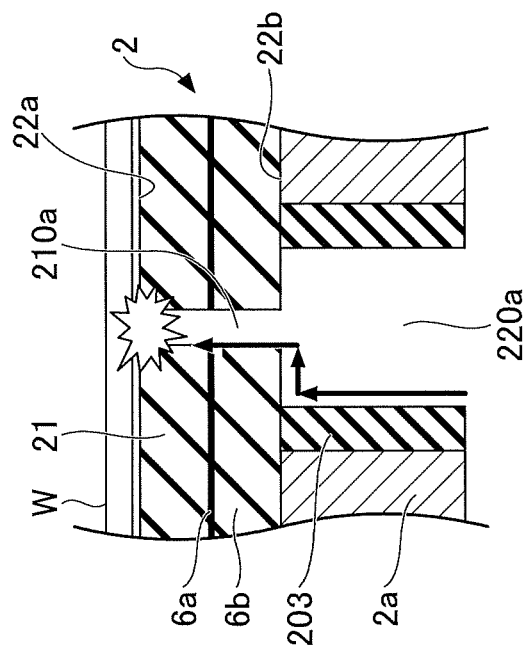

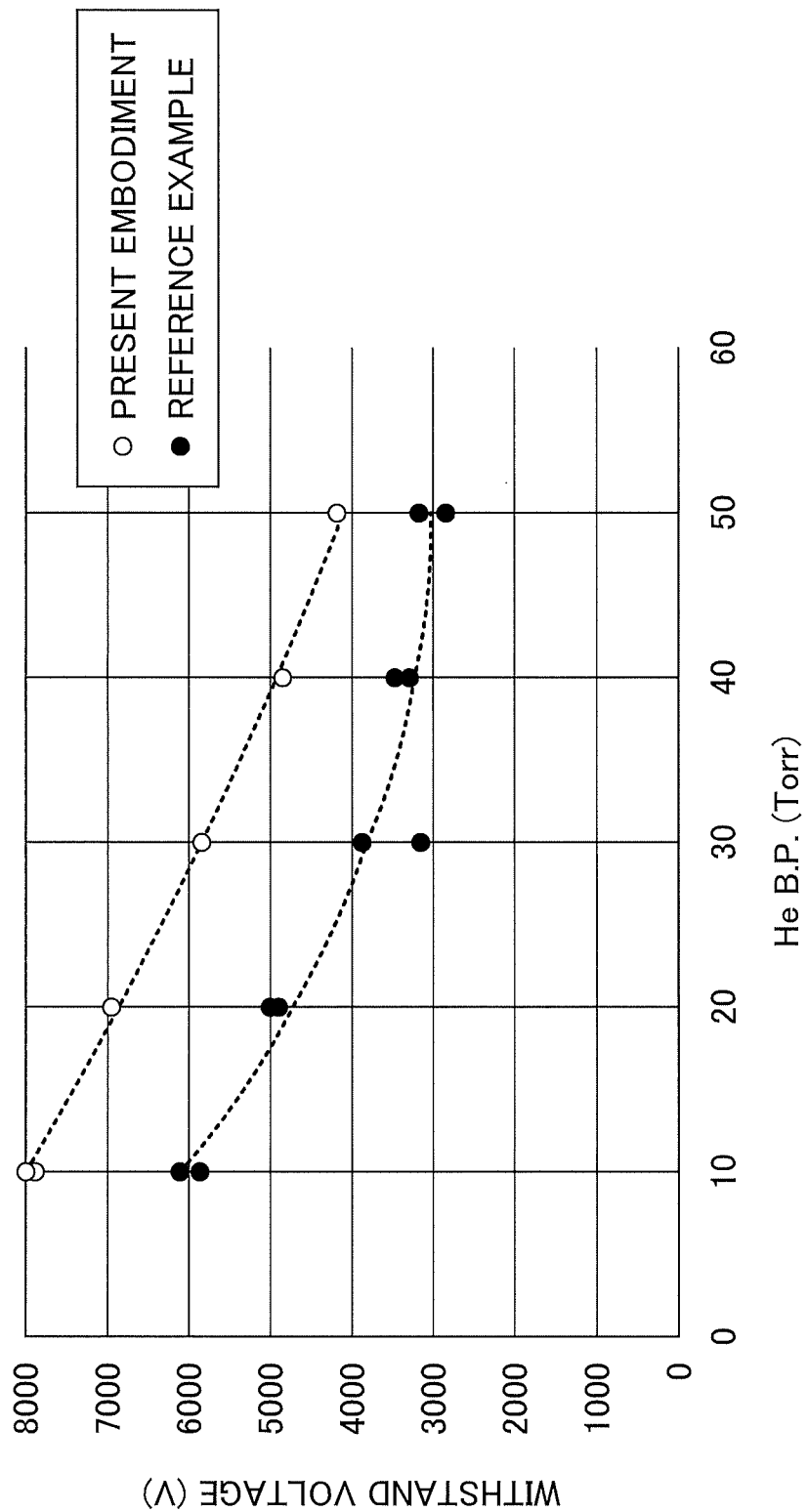

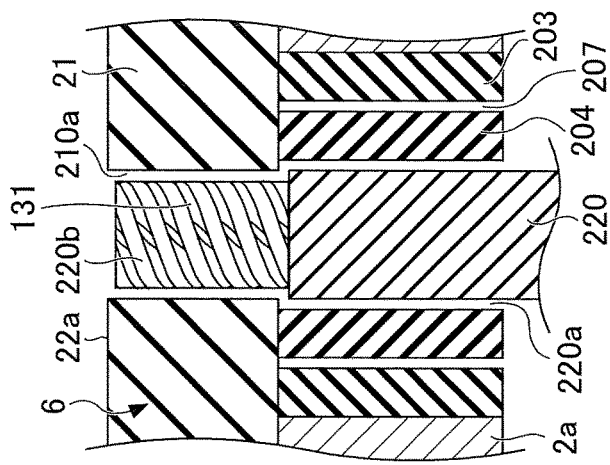
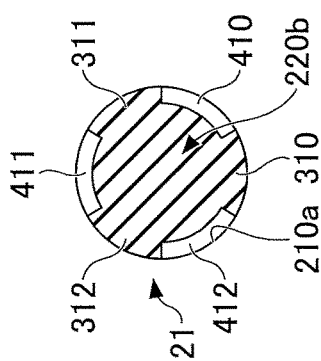
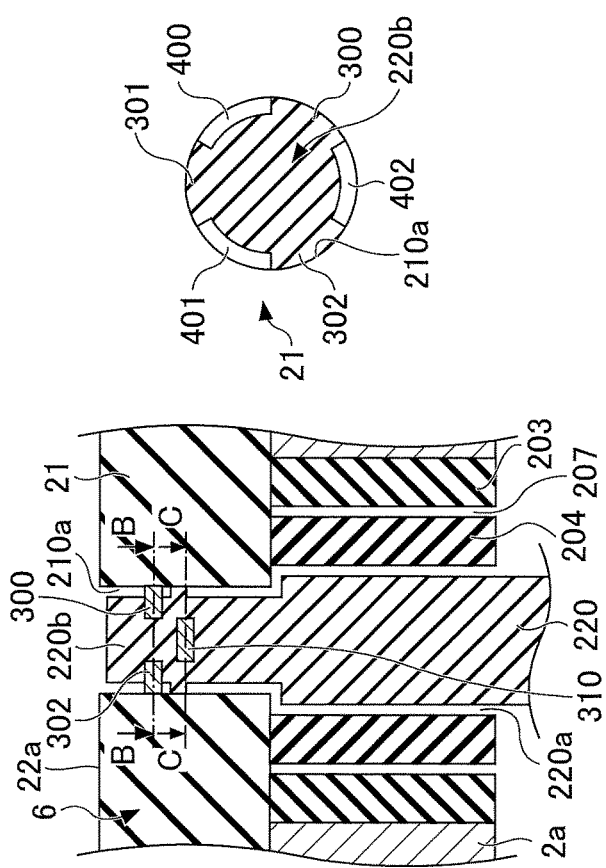

STAGE AND PLASMA PROCESSING APPARATUS

CROSS-REFERENCE TO RELATED APPLICATION

This patent application claims priority to Japanese Patent Application No. 2020-39924, filed Mar. 9, 2020, the entire contents of which are incorporated herein by reference in their entirety.

TECHNICAL FIELD

The present disclosure relates to a stage and a plasma processing apparatus.

BACKGROUND

Plasma processing apparatuses include stages for mounting substrates, in processing chambers each of which can have a vacuum space, and each stage serves as an electrode. In such a stage having a through-hole passing through a mounting surface for a substrate, a heat transfer gas flows through the through-hole and is supplied to a portion between a lower surface of the substrate and the mounting surface of the stage. For example, Unexamined Japanese Patent Publication No. 2018-56372, which is hereafter referred to as Patent document 1, proposes inserting a cylindrical gas spacer into a through-hole for a heat transfer gas, and the gas spacer is formed of an insulator such as a ceramic.

SUMMARY

According to one manner of the present disclosure, a stage to be disposed in a chamber of a plasma processing apparatus is provided. The stage includes a chuck including a first mounting portion for a substrate and a first hole through the first mounting portion. The stage includes a base disposed beneath the chuck, the base including a second hole through the base, and the second hole communicating with the first hole. The stage includes a first cylindrical liner disposed in the second hole, the first cylindrical liner having a relative permittivity of 5 or less.

BRIEF DESCRIPTION OF THE DRAWINGS

FIGS. 4A and 4B are diagrams for describing abnormal discharge occurring in a stage in a reference example;

FIG. 6 is a diagram illustrating an example of test results for abnormal discharge according to one embodiment; and FIGS. 7A to 7D are diagrams illustrating an example of an insertion member inserted into through-holes according to one embodiment.

DETAILED DESCRIPTION

One or more embodiments of the present disclosure will be described with reference to the drawings. In each drawing, the same numerals denote the same components, and duplicate description for the components may be omitted.

[Plasma Processing Apparatus]

Figure 1:
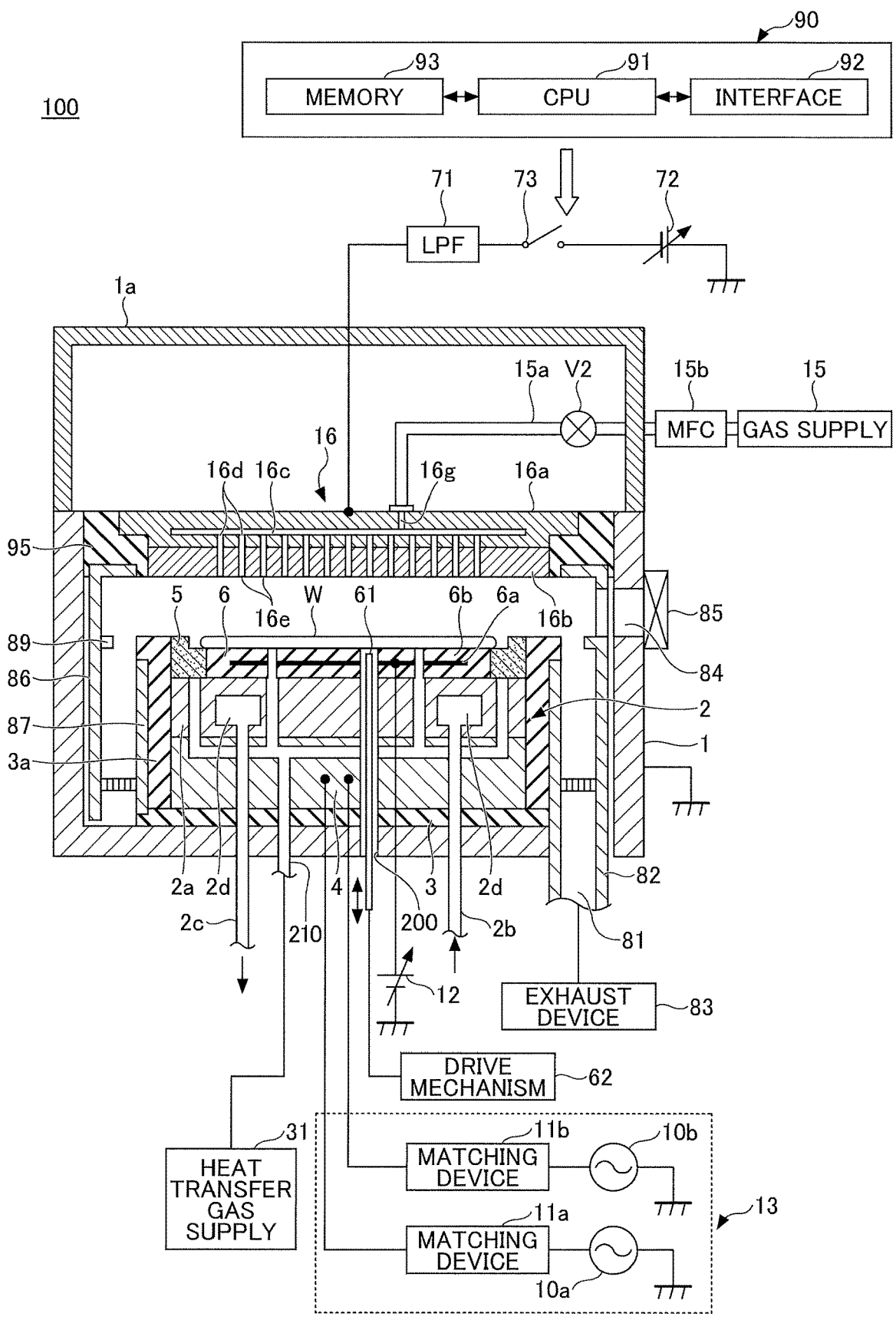
FIG. 1 is a cross-sectional view schematically illustrating an example of a plasma processing apparatus according to one embodiment.

A plasma processing apparatus 100 according to one embodiment will be described with reference to FIG. 1. FIG. 1 is a cross-sectional view schematically illustrating an example of the plasma processing apparatus 100 according to one embodiment. The plasma processing apparatus 100 includes a chamber 1 that is hermetically sealed and that is electrically grounded. The chamber 1 is cylindrical and is formed of aluminum or the like, for example. The chamber 1 has a process space at which a plasma is formed. A stage 2 on which a substrate W is mounted is provided in the chamber 1. An example of the substrate W is a wafer. The stage 2 includes a base 2a and an electrostatic chuck 6. The base 2a is formed of a conductive metal such as aluminum. The electrostatic chuck 6 is formed of a ceramic such as alumina. The electrostatic chuck 6 electrostatically attracts the wafer W. The stage 2 may further include an electrode plate 4. The electrode plate 4 is supported by a support 3 that is formed of quartz or the like, for example. The base 2a is provided on the electrode plate 4, and the electrostatic chuck 6 is provided on the base 2a. On the base 2a, an edge ring 5 is disposed in the outer periphery of the electrostatic chuck 6. For example, the edge ring 5 is formed of silicon. The edge ring 5 is also referred to as a focus ring. A cylindrical inner wall member 3a, which is formed of, for example, quartz or the like, is provided in the chamber 1, so as to circumscribe the stage 2.

The electrostatic chuck 6 is configured such that an electrode 6a is embedded in an insulator 6b. A direct current (DC) power source 12 is connected to the electrode 6a. When the DC power source 12 applies a DC voltage to the electrode 6a, the substrate W is held on the electrostatic chuck 6 through a resulting coulomb force. Note that instead of the electrostatic chuck 6, the stage 2 may include a chuck that mechanically secures the substrate W.

A coolant flow path 2d is formed in an interior of the base 2a, and a coolant inlet line 2b and a coolant outlet line 2c are connected to the coolant flow path 2d. By circulating a coolant such as cooling water through the coolant flow path 2d, the stage 2 is adjusted to a predetermined temperature.

A gas supply line 210 for supplying a gas for heat transfer (hereafter referred to as a heat transfer gas), such as helium gas, is provided in an interior of the stage 2. The gas supply line 210 is connected to a heat transfer gas supply 31. The gas supply line 210 communicates with through-holes in the stage 2, as described above. The through-holes each pass through to a corresponding mounting surface among a substrate-mounting surface for the substrate W and an edge-ring mounting surface for the edge ring 5, such that the corresponding mounting surface has an opening. With such a configuration, the heat transfer gas supply 31 supplies, through the gas supply line 210, the heat transfer gas to a portion between a lower surface of the substrate W and the substrate mounting surface. The heat transfer gas supply 31 also supplies, through the gas supply line 210, the heat transfer gas to a portion between a lower surface of the edge ring 5 and the edge-ring mounting surface. Thus, cooling efficiency of the substrate W and the edge ring 5 is increased.

Through-holes 200 for a pin are provided in the stage 2 (only one through-hole is illustrated in FIG. 1). For example, the through-holes 200 are three through-holes. Lifter pins 61 are provided in the respective through-holes 200 for a pin. Each lifter pin 61 is connected to a drive mechanism 62 and is raised or lowered by the drive mechanism 62.

A radio frequency (RF) source 13 is connected to the electrode plate 4. In the embodiment described in FIG. 1, a first RF power source 10a is connected to the electrode plate 4 via a matching device 11a, and a second RF power source 10b is connected via a matching device 11b. The first RF power source 10a supplies RF power for plasma formation at a given frequency to the electrode plate 4. The second RF power source 10b supplies, to the electrode plate 4, RF power for drawing ions at a lower frequency than the frequency of RF power output from the first RF power source 10a. With such a configuration, the stage 2 to which RF power can be applied serves as a lower electrode.

A showerhead 16 that faces the stage 2 and that serves as an upper electrode is provided above the stage 2. The showerhead 16 is provided in a top wall of the chamber 1. The showerhead 16 includes an electrode plate 16b and a support member 16a supporting the electrode plate 16b. The showerhead 16 is supported at an upper portion of the chamber 1, by using an insulating member 95. The support member 16a is formed of a conductive material such as an aluminum metal of which the surface is anodized. The support member 16a removably supports the electrode plate 16b beneath the support member 16a.

A gas diffusion compartment 16c is provided in the support member 16a. Gas flow holes 16d are formed at a lower portion of the support member 16a, so as to be located at a lower portion of the gas diffusion compartment 16c. Gas discharge holes 16e pass through the electrode plate 16b in a thickness direction. The gas discharge holes 16e also communicate with the respective gas flow holes 16d.

A gas inlet 16g for supplying a process gas to the gas diffusion compartment 16c is formed in the support member 16a. A gas supply line 15a is connected to the gas inlet 16g. In sequential order from upstream, a gas supply 15 that supplies a process gas, a mass flow controller (MFC) 15b, and an on-off valve V2 are connected to the gas supply line 15a. The process gas is supplied, via the gas supply line 15a, to the gas diffusion compartment 16c from the gas supply 15. The process gas supplied to the gas diffusion compartment 16c is supplied to the chamber 1 through the gas flow holes 16d and the gas discharge holes 16e, such that the process gas is showered.

A variable DC power source 72 is electrically connected to the showerhead 16 via a low pass filter (LPF) 71. The variable DC power source 72 can be powered on or off by an on-off switch 73. A current flowing through the variable DC power source 72 and a voltage across the variable DC power source 72 are each adjusted by a controller 90. Also, the on-off switch 73 is turned on or off under a control of the controller 90. Note that when the first RF power source 10a or the second RF power source 10b supplies RF power to the stage 2 to thereby form a plasma at a process space, the controller 90 turns the on-off switch 73 on as needed and thus a given DC voltage is applied to the showerhead 16.

A cylindrical ground conductor 1a is provided to extend from an upper sidewall of the chamber 1, such that the cylindrical ground conductor 1a is situated above a height level of the showerhead 16.

An exhaust port 81 is formed at the bottom of the chamber 1. An exhaust device 83 is connected to the exhaust port 81 through an exhaust pipe 82. The exhaust device 83 has a vacuum pump. By operating the vacuum pump, the exhaust device 83 causes the chamber 1 to be depressurized up to a predetermined vacuum level. A loading port 84 for the substrate W is provided at a given sidewall of the chamber 1, and a gate valve 85 for opening or closing of the loading port 84 is attached to the loading port 84.

A shield 86 against deposits is provided along an inner wall surface of the chamber 1. The shield 86 prevents byproducts (deposits) caused by an etch from adhering to the chamber 1. A conductive member (GND block) 89 that is grounded is provided on the shield 86 at a height approximately the same as the substrate W. Thus, abnormal discharge is prevented. A shield 87 against deposits extending along an inner wall member 3a is provided with respect to a lower portion of the shield 86. The shields 86 and 87 are detachable.

A controller 90 controls the whole operation of the plasma processing apparatus 100. The controller 90 includes a central processor unit (CPU) 91 that controls each component of the plasma processing apparatus 100. The controller 90 also includes an interface 92 and a memory 93.

The interface 92 includes a keyboard, a display, and the like. For example, the keyboard is used for performing an operation to input commands, in order for a process manager to manage the plasma processing apparatus 100. For example, the display is used for visually displaying a status in which the plasma processing apparatus 100 operates.

The memory 93 stores one or more recipes. In each recipe, a control program, process condition data, and the like are set. The control program and process condition data are used for causing the CPU to execute various processes at the plasma processing apparatus 100. When the CPU 91 retrieves any recipe from the memory 93 and executes the retrieved recipe, a plasma process is performed at the plasma processing apparatus 100. Any recipe in which a control program, process condition data, or the like is set can be available in a manner such that the recipe is stored on a computer readable storage medium (such as a hard disk, a compact disc, a flexible disc, or a semiconductor memory) or the like. For example, any recipe in which a control program, process condition data, or the like is set can be available online in a manner such that the recipe is transmitted from another device via a dedicated line, as needed.

[Stage Configuration]

Figure 2:
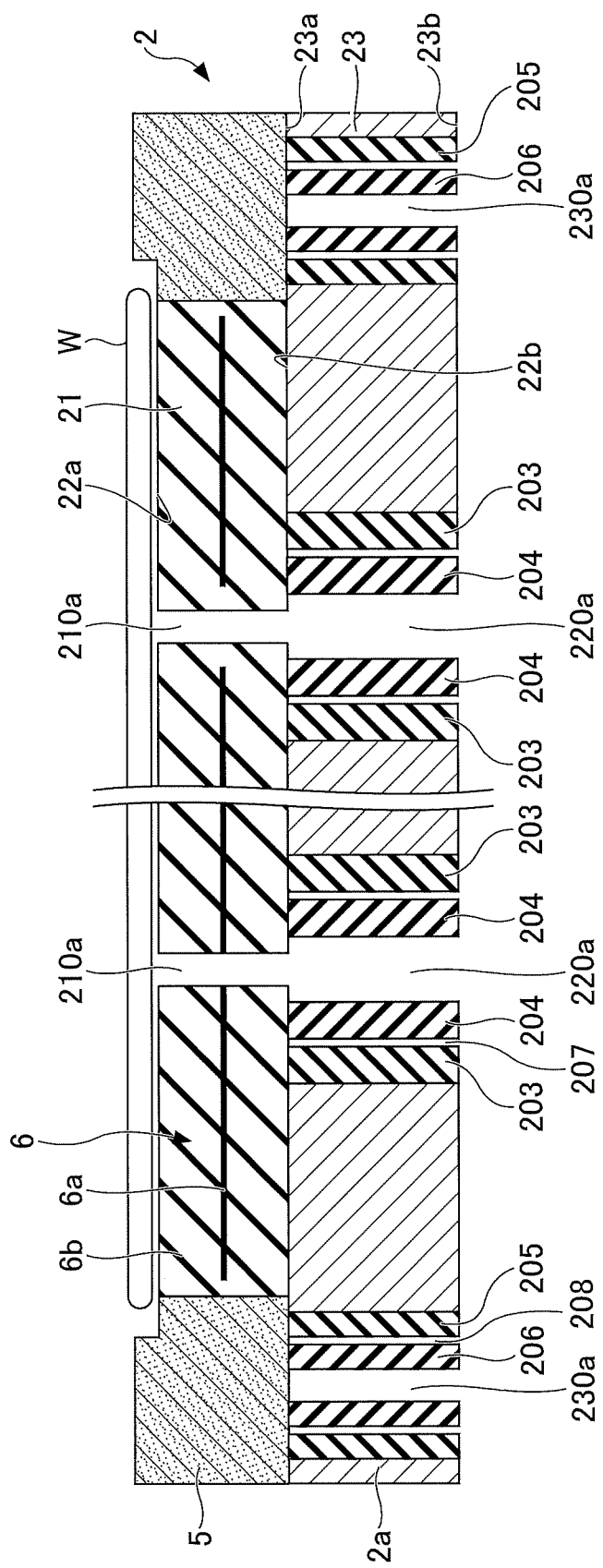
FIG. 2 is a diagram illustrating an example of a stage according to one embodiment.

Hereafter, an example of the configuration of the stage 2 will be described with reference to FIG. 2. FIG. 2 is a cross-sectional view schematically illustrating the stage 2 according to the present embodiment. In FIG. 2, the base 2a and the electrostatic chuck 6 are illustrated and the electrode plate 4 is omitted. The electrostatic chuck 6 is approximately disk-shaped and has a substrate mounting portion 21 on which the substrate W is to be mounted.

First through-holes 210a are each formed through the substrate mounting portion 21 of the electrostatic chuck 6 in a thickness direction, so as to pass from a given surface (substrate mounting surface 22a) of the electrostatic chuck 6 to a lower surface 22b thereof. The base 2a is bonded to the lower surface 22b of the electrostatic chuck 6, with an adhesive (not illustrated). Second through-holes 220a in communication with the respective first through-holes 210a are provided in the base 2a. A member that constitutes the electrostatic chuck 6 such as alumina ($Al_2O_3$) is partially exposed from an inner surface of each first through-hole 210a. An inner surface of each second through-hole 220a is covered by a first cylindrical liner 204 inserted into a given first sleeve 203. A metal such as aluminum that constitutes the base 2a is not exposed.

Each first cylindrical liner 204 is a cylindrical member inserted into a given second through-hole 220a. Each first cylindrical liner 204 is formed of a dielectric having a relative permittivity of 5 or less. For example, each first cylindrical liner 204 may be formed of perfluoroalkoxy alkane (PFA), polytetrafluoroethylene (PTFE), or polychlorotrifluoroethylene (PCTFE). Each first cylindrical liner 204 is preferably formed of a fluorine-containing material with great plasma resistance.

First sleeves 203 are each provided between a given first cylindrical liner 204 and the base 2a. Each first sleeve 203 is formed of a dielectric (insulator) having a greater relative permittivity than the first cylindrical liner 204. Each first sleeve 203 is formed of a member having a relative permittivity between 10 and 20, and a ceramic such as alumina is an example of such a member.

The base 2a has an edge-ring mounting portion 23 on which the edge ring 5 is mounted along the circumference of the substrate mounting portion 21. Third through-holes 230a are each formed through the edge-ring mounting portion 23 in a thickness direction, so as to pass from an edge-ring mounting surface 23a of the edge-ring mounting portion 23 to a lower surface 23b thereof. An inner surface of each third through-hole 230a is covered by a given second cylindrical liner 206 inserted into a given second sleeve 205. A metal such as aluminum that constitutes the base 2a is not exposed.

Each second cylindrical liner 206 is a cylindrical member inserted into a given third through-hole 230a. Each second cylindrical liner 206 is formed of a dielectric having a relative permittivity of 5 or less. The relative permittivity is preferably 3 or less. For example, each second cylindrical liner 206 may be formed of PFA, PTFE, or PCTFE. Each second cylindrical liner 206 is preferably formed of a fluorine-containing material with great plasma resistance.

Each second sleeve 205 is provided between a given second cylindrical liner 206 and the base 2a. Each second sleeve 205 is formed of a dielectric (insulator) having a higher relative permittivity than the second cylindrical liner 206. Each second sleeve 205 is formed of a member having a relative permittivity between 10 and 20, and a ceramic such as alumina is an example of such a member.

Figure 3:
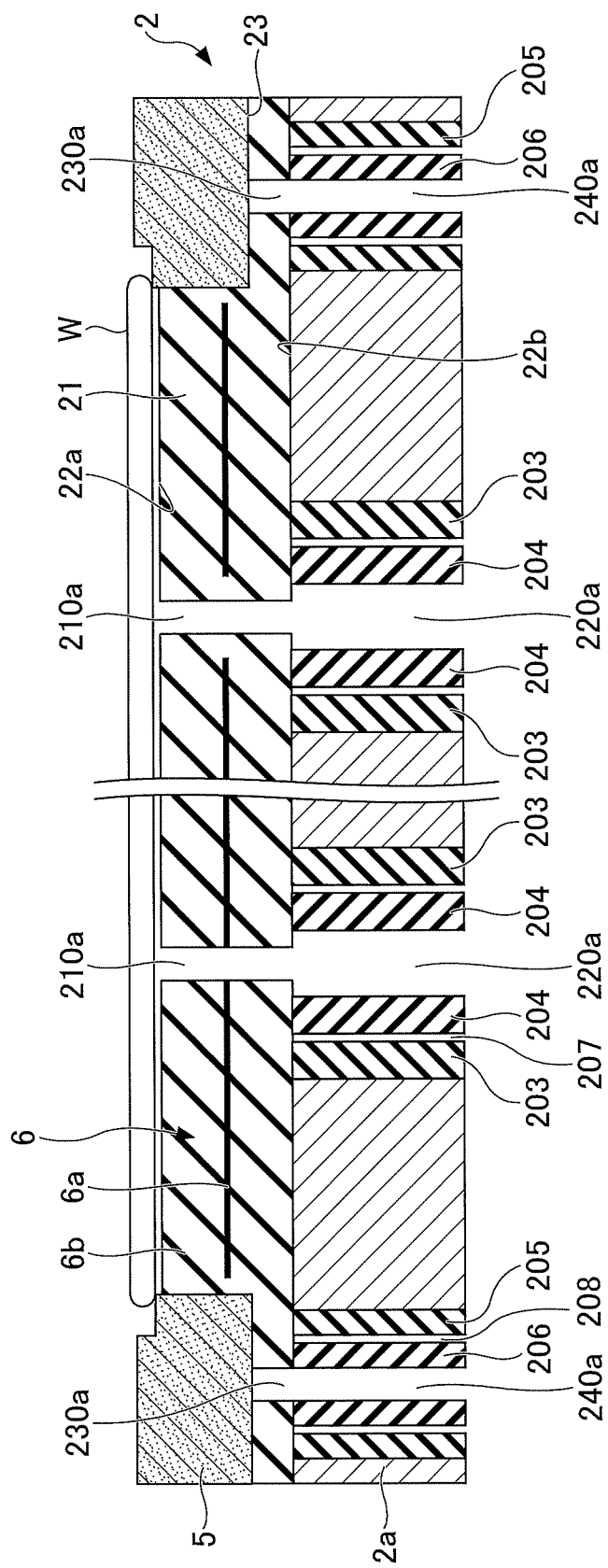
FIG. 3 is a diagram illustrating an example of a stage according to another embodiment.

Note that the edge-ring mounting portion 23 may be provided in the electrostatic chuck 6, as illustrated in FIG. 3. In this case, third through-holes 230a through the edge-ring mounting portion 23 are formed in the electrostatic chuck 6, and fourth through-holes 240a in communication with the respective third through-holes 230a are formed in the base 2a. The second cylindrical liners 206 are each inserted into a given fourth through-hole 240a, and the second sleeves 205 are each provided between a given second cylindrical liner 206 and the base 2a.

Hereafter, abnormal discharge that occurs in the stage 2 from which the first cylindrical liners 204 are removed will be described with reference to FIGS. 4A and 4B illustrating a reference example.

As illustrated in FIG. 4A, the stage 2 in the reference example does not have a cylindrical liner 204, and the inner surface of a given second through-hole 220a is covered by the first sleeve 203.

For stages, higher RF power has been applied to the stages in recent years. Especially, in a process of forming one or more deep holes in a given substrate W, the substrate is etched with higher RF power.

In FIG. 4A, a heat transfer gas is supplied to a portion between the substrate W and the substrate mounting surface 22a of the stage 2, through the base 2a and the first through-hole 210a. When higher RF power is applied to the stage 2, a potential difference between the substrate W and the base 2a occurs, and thus a potential at the inner surface of the first sleeve 203, which is a dielectric (insulator) such as a ceramic, becomes high. At this time, if the interior of the base 2a and the first through-hole 210a were in a vacuum state, abnormal discharge would not occur. However, in actuality, the heat transfer gas flows through the base 2a and the first through-hole 210a. In other words, the heat transfer gas flows through the stage 2 that serves as an electrode, and then reaches the lower surface of the substrate W.

The first sleeve 203 that is an insulator such as a ceramic is disposed in a given through-hole that is a flow path for a heat transfer gas. Thus, charge in the base 2a and the substrate W is reduced and abnormal discharge might be thereby prevented. For example, for a ceramic having a relative permittivity that is approximately between 10 and 20, insulating characteristics are great. However, when a potential is applied to a ceramic, electric charge stored in the ceramic becomes high. Moreover, when higher RF power is applied to the stage 2, a potential difference between the base 2a and the substrate W occurs increasingly. Consequently, abnormal discharge may be likely to occur.

In such a case, as illustrated in FIG. 4B, when the heat transfer gas flows, abnormal discharge occurs in one or more through-holes through the base 2a and the electrostatic chuck 6, as well as between the lower surface of the substrate W and the stage 2. The abnormal discharge may result in electric damage to a circuit that is formed on the substrate W. Moreover, the abnormal discharge results in production of abnormal heat, and consequently, there may be cases of reducing a yield rate.

In contrast, in the stage 2 according to the present embodiment described in FIG. 2, the first cylindrical liners 204 each of which has a lower relative permittivity than the first sleeve 203 are respectively disposed in the second through-holes 220a. Thus, a potential at an inner wall surface of a given first cylindrical liner 204 through which a heat transfer gas flows is reduced. Accordingly, a potential difference between the inner wall surface and outer wall surface for a given flow path of a heat transfer gas is reduced. As a result, electron avalanche is avoided, thereby enabling abnormal discharge to be prevented.

For example, when a fluorocarbon polymer-containing material having a lower relative permittivity (e.g., a relative permittivity of PTFE is 2) than the first sleeve 203 having a relative permittivity of 10 is supplied with a potential, an amount of electric charge in the fluoropolymer-containing material is small. In light of such a material characteristic, the first cylindrical liner 204 formed of a fluorocarbon polymer-containing material is used to reduce a potential at the inner wall surface of each first through-hole 210a in contact with a heat transfer gas, so that electron avalanche is avoided.

Note that the first sleeves 203 may not be each provided between the base 2a and a given first cylindrical liner 204. However, it may be difficult to directly attach the first cylindrical liner 204, which is formed of a fluorine-containing material, to the base 2a. For this reason, each first sleeve 203, which is capable of directly adhering to the base 2a, is preferably provided between the base 2a and a given first cylindrical liner 204. For example, the first sleeve 203 is pressed into a given first through-hole 210a, and a given first cylindrical liner 204 is secured to an interior of the first sleeve 203. Note that the first cylindrical liners 204 are each formed of a fluorine-containing material with excellent plasma resistance. Preferably, the first cylindrical liners 204 are replaceable members. Also, the first sleeves 203 and the second sleeves 205 are preferably replaceable members, from the viewpoint of maintenance of the sleeves.

As described above, abnormal discharge caused by the potential difference between the substrate W and the base 2a, as well as prevention of the abnormal discharge by using the first cylindrical liner 204, have been described with reference to FIGS. 2 to 4B. Likewise, a potential difference between the edge ring 5 and the base 2a may result in occurrence of abnormal discharge. However, with use of each second cylindrical liner 206, abnormal discharge can be prevented, as with the first cylindrical liner 204.

[Test]

Figure 5:
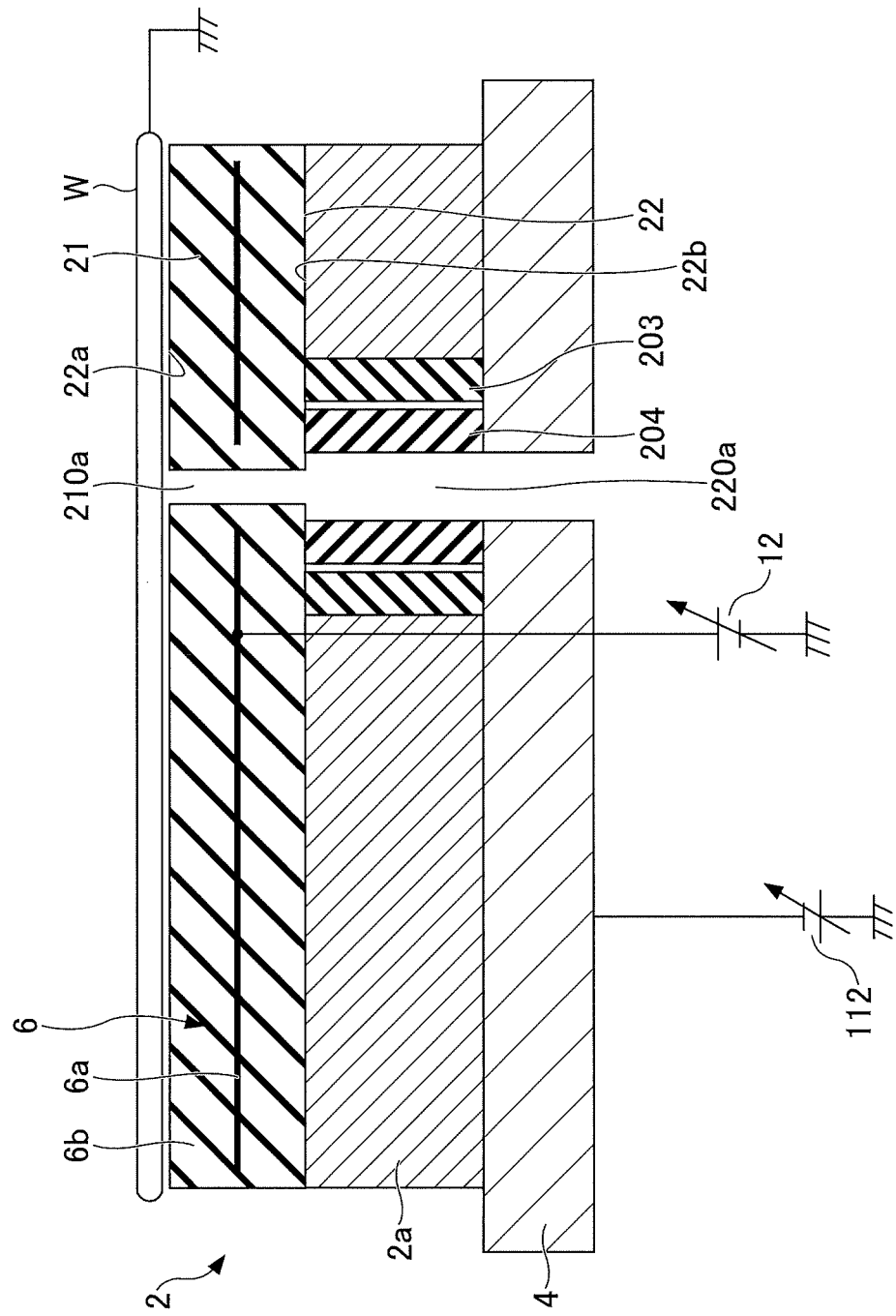
FIG. 5 is a diagram for describing a test for abnormal discharge according to one embodiment.

Hereafter, a test for abnormal discharge in the stage 2 according to the present embodiment will be described with reference to FIGS. 5 and 6. FIG. 5 is a diagram for describing the test for abnormal discharge according to one embodiment. FIG. 6 is a diagram for describing an example of test results for abnormal discharge according to one embodiment.

In the test, a test device illustrated in FIG. 5, which was assumed to be the stage 2 according to one embodiment, was used. The test device was disposed in a vacuum chamber, and the DC power source 12 was connected to the electrode 6a of the electrostatic chuck 6. Further, another DC power source 112 was connected to the electrode plate 4 beneath the base 2a, in order to measure a given voltage and a given current.

In the test in which the test device was used, the following steps (1) to (6) were taken and thus occurrence of abnormal discharge was tested in the first through-hole 210a and the second through-hole 220a.

(1) The first cylindrical liner 204 was inserted into the second through-hole 220a.
(2) A given substrate W was mounted on the substrate mounting surface 22a and then a given process space is evacuated.
(3) The DC power source 12 applied a DC voltage of 3.5 kV to the electrode 6a, and the substrate W was thereby attracted to the electrostatic chuck 6.
(4) As an example of a heat transfer gas, helium gas between 10 Torr and 50 Torr (between 1333 Pa and 6666 Pa) was used. The helium gas was supplied to the process space and then pressure of the process space was adjusted.
(5) The DC power source 112 applied a negative DC voltage to the electrode plate 4 of the stage 2. In accordance with the applied DC voltage, a DC voltage across the electrode plate 4 and the wafer W gradually increased.
(6) A current flowing through the substrate W and the electrostatic chuck 6, as well as a voltage across the substrate W and the electrostatic chuck 6, were measured.

In the test described above, a voltage measured when the current flowed through the substrate W and the electrostatic chuck 6, was given as a "withstand voltage". When the current increased rapidly, abnormal discharge was assumed to occur. FIG. 6 is a graph illustrating test results.

In FIG. 6, the horizontal axis represents the pressure of helium gas flowing through the first through-hole 210a. In other words, the horizontal axis represents the pressure of the lower surface of the substrate W. The vertical axis represents the withstand voltage. In FIG. 6, test results with respect to a reference example are also shown, where the first cylindrical liner 204 was not inserted into the second through-hole 220a, as described in FIGS. 4A and 4B. In the reference example, steps (2) to (6) above were taken.

In the results in FIG. 6 according to the present embodiment in which after helium gas between 10 Torr and 50 Torr was supplied to the process space, the first cylindrical liner 204 was inserted into the second through-hole 220a, the discharge voltage (withstand voltage) was about 2000 V higher than the discharge voltage measured in the reference example. In other words, for the stage 2 according to the present embodiment in which the first cylindrical liner 204 was inserted into the second through-hole 220a, with use of the first cylindrical liner 204, a potential at the inner wall surface of a given flow path in contact with helium gas was reduced, thereby enabling a potential difference between the inner surface and outer surface of the flow path for helium gas to become low. As a result, in the stage 2 according to the present embodiment, the withstand voltage became high, so that abnormal discharge could be effectively prevented.

[First Modification: Insertion Member Inserted into Through-Holes]

Hereafter, an insertion member inserted into through-holes will be described with reference to FIGS. 7A to 7D. FIGS. 7A to 7D are diagrams illustrating an example of an insertion member 220 inserted into the first through-hole 210a and the second through-hole 220a according to one embodiment.

According to the first modification, the insertion member 220 is provided in the first through-hole 210a and the second through-hole 220a. For example, in the example of FIGS. 7A and 7B, recesses and protrusions are formed on a portion of the surface of the insertion member 220.

As illustrated in FIG. 7A, a top of an upper end portion 220b of the insertion member 220 is located slightly lower than the substrate mounting surface 22a. A space is provided between the insertion member 220 and an inner wall of each of the first through-hole 210a and the second through-hole 220a. Each space serves as a flow path for a heat transfer gas. Protrusions 300, 302, and 310, and the like alternately protrude radially from the upper end portion 220b of the insertion member 220, with respect to two layers constituted by the protrusions. According to the modification, the protrusions are provided to constitute two layers. However, the number of protrusions, as well as the number of layers constituted by the protrusions, are not limited to the examples described above.

FIG. 7B is a cross-sectional view illustrating an example of the insertion member 220 taken along the B-B line illustrated in FIG. 7A. Specifically, FIG. 7B illustrates the cross section of protrusions that constitute an upper layer and that are formed on the upper end portion 220b. FIG. 7C is a cross-sectional view illustrating an example of the insertion member 220 taken along the C-C line illustrated in FIG. 7A. Specifically, FIG. 7C illustrates the cross section of protrusions that constitute a lower layer and that are formed on the upper end portion 220b.

In the cross section taken along the B-B line, as illustrated in FIG. 7B, three protrusions 300, 301, and 302 are equiangularly formed to protrude from the upper end portion 220b. Also, gaps 400, 401, and 402 are each formed between given two protrusions among the protrusions 300, 301, and 302.

In the cross section taken along the C-C line, as illustrated in FIG. 7C, three protrusions 310, 311, and 312 are equiangularly formed to protrude from the upper end portion 220b. Also, gaps 410, 411, and 412 are each formed between given two protrusions among the protrusions 310, 311, and 312.

The protrusions 300 to 302, as well as the protrusions 310 to 312, are alternately arranged, for a corresponding layer among the different layers. The protrusions 300 to 302 are each positioned above a corresponding gap among the gaps 410 to 412, and the protrusions 310 to 312 are each positioned below a corresponding gap among the gaps 400 to 402.

With such a configuration, when the first through-hole 210a illustrated in FIG. 7A is viewed from the top, the gaps 410 to 412 for the lower layer, which are provided between the first through-hole 210a and the insertion member 220, are not visible because the protrusions 300 to 302 constituting the upper layer are disposed.

According to the modification, the first through-hole 210a formed in the stage 2 can cause a distance at which electrons are accelerated to be shortened. Thus, abnormal discharge can be prevented. In this case, when such an effect described above is combined with the effect described in one or more embodiments, e.g., a potential at the inner wall surface of the first cylindrical liner 204 in contact with helium gas is reduced to thereby decrease a potential difference between the inner surface and outer surface of a given flow path for helium gas, abnormal discharge can be more effectively prevented.

Note that one or more spiral grooves may be formed on a portion of the insertion member 220 that is inserted into the first through-hole 210a, in order to allow a heat transfer gas to flow through the spiral grooves. In the example illustrated in FIG. 7D, spiral grooves 131 are formed on the outer periphery of the upper end portion 220b of the insertion member 220.

Note that the insertion member 220 may be formed of a silicon-containing material such as silicon carbide (SiC). One or more recesses, one or more protrusions, or any combination thereof may be formed with respect to a given portion of the insertion member 220 that is inserted into the second through-hole 220a. Alternatively, a recess, a protrusion, or both thereof may not be formed with respect to a given portion of the insertion member 220 that is inserted into the first through-hole 210a.

Modifications

In the above description, the first through-holes 210a and the second through-holes 220a are holes for supplying a heat transfer gas, but are not limited to the example described above. The first through-holes 210a and the second through-holes 220a may be through-holes for lifter pins 61, and each lifter pin 61 is used to raise or lower the substrate W.

The third through-holes 230a are holes for supplying a heat transfer gas. However, when the edge ring 5 is transportable, the third through-hole 230a may be a through-hole for a pin that is used to raise or lower the edge ring 5. Inner liners such as the first cylindrical liners 204 according to one or more embodiments can be each used as a gas flow path in an interior of a given member to which a voltage is applied, in the plasma processing apparatus 100.

As illustrated in FIGS. 7A to 7D and the like, the first sleeves 203 and the second sleeves 205 are each attached to the electrostatic chuck 6 with an adhesive not illustrated. Further, each first cylindrical liner 204 is pressed into and secured to a given second through-hole 220a, and each second cylindrical liner 206 is pressed into and secured to a given third through-hole 230a. With such a configuration, a given insertion member 220 engages with a given inner liner among the first cylindrical liners 204 and the second cylindrical liners 206, thereby enabling the insertion member 220 to be secured to the inner liner.

Spaces (hereafter referred to as depressurization spaces) 207 that can be depressurized to a predetermined vacuum level during plasma processing may be each formed between a given first sleeve 203 and a given first cylindrical liner 204. Also, spaces (hereafter referred to as depressurization spaces) 208 that can be depressurized to a predetermined vacuum level during plasma processing may be each formed between a given second sleeve 205 and a given second cylindrical liner 206. Each depressurization space 207 has a lower relative permittivity than the first cylindrical liners 204, and each depressurization space 208 has a lower relative permittivity than the second cylindrical liners 206. Thus, in addition to a given cylindrical liner among the first cylindrical liners 204 and the second cylindrical liners 206, a given depressurization space among the depressurization spaces 207 and 208 is also used to enable the potential at the inner wall surface of a given flow path for a heat transfer gas to be decreased.

For a given space between the first sleeve 203 and the first cylindrical liner 204, the first sleeve 203 may be partially provided in contact with the first cylindrical liner 204. The depressurization spaces 207 and 208 may be gaps each of which is between a given cylindrical liner and a given sleeve. Alternately, the depressurization spaces 207 and 208 may be recesses each of which is provided in a given cylindrical liner.

While one or more embodiments have been described using the stage and the plasma processing apparatus, the embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The plasma processing apparatus in the present disclosure is applicable to an automatic layer deposition (ALD) apparatus. Also, the plasma processing apparatus is applicable to any type among a capacitively coupled plasma (CCP), an inductively coupled plasma (CP), a radial line slot antenna (RLSA), an electron cyclotron resonance plasma (EOR), and a helicon wave plasma (HWP).

The plasma processing apparatus is not limited to an apparatus that etches a substrate. The plasma processing apparatus may be an apparatus in which a predetermined process (for example, deposition, cleaning, or the like) is performed with respect to a substrate. The plasma processing apparatus may process a substrate with a plasma, or may process a substrate without using a plasma.

According to the present disclosure, abnormal discharge can be prevented.

What is claimed is:

1. A stage to be disposed in a chamber of a plasma processing apparatus, the stage comprising:
   a chuck including a first mounting portion for a substrate and a first hole through the first mounting portion;
   a base disposed beneath the chuck, the base including a second hole through the base, and the second hole communicating with the first hole;
   a first cylindrical liner disposed in the second hole, the first cylindrical liner having a relative permittivity of 5 or less; and
   a first sleeve between the first cylindrical liner and the base, the first sleeve having a higher relative permittivity than the first cylindrical liner.

2. The stage according to claim 1, wherein the first cylindrical liner is formed of a fluorine-containing material.

3. The stage according to claim 1, wherein a space to be depressurized for plasma processing is provided between the first cylindrical liner and the first sleeve.

4. The stage according to claim 1, further comprising an insertion member accommodated in the first hole and the second hole,
wherein the chuck includes an upper surface, and
wherein a top surface of the insertion member is disposed at a location lower than the upper surface of the chuck.

5. The stage according to claim 1, wherein the first hole and the second hole are gas supply holes for a heat transfer gas.

6. The stage according to claim 1, wherein the chuck is an electrostatic chuck.

7. The stage according to claim 4, wherein the base includes a top surface,
wherein the insertion member is provided through the first hole and the second hole, and extends within an interior of the chuck and the base, and
wherein the top surface of the insertion member is positioned lower than the top surface of the chuck.

8. The stage according to claim 7, wherein the insertion member includes a peripheral side surface within the interior of the base, and
wherein the peripheral side surface includes at least one of a radially extending protrusion or a radially extending recess.

9. The stage according to claim 1, further comprising an insertion member provided through the first hole and the second hole, the insertion member extending within an interior of the chuck and the base,
wherein the insertion member includes a peripheral side surface within the interior of the base, and
wherein the peripheral side surface includes at least one of a radially extending protrusion or a radially extending recess.

10. The stage according to claim 2, wherein a space to be depressurized for plasma processing is provided between the first cylindrical liner and the first sleeve.

11. The stage according to claim 10, further comprising an insertion member accommodated in the first hole and the second hole,
wherein the chuck includes an upper surface, and
wherein a top surface of the insertion member is disposed at a location lower than the upper surface of the chuck.

12. The stage according to claim 11, wherein the first hole and the second hole are gas supply holes for a heat transfer gas.

13. The stage according to claim 12, wherein the base includes a top surface,
wherein the insertion member is provided through the first hole and the second hole, and extends within an interior of the chuck and the base, and
wherein the top surface of the insertion member is positioned lower than the top surface of the chuck.

14. The stage according to claim 13, wherein the insertion member includes a peripheral side surface within the interior of the base, and
wherein the peripheral side surface includes at least one of a radially extending protrusion or a radially extending recess.

15. A stage to be disposed in a chamber of a plasma processing apparatus, the stage comprising:
a chuck including a first mounting portion for a substrate and a first hole through the first mounting portion;
a base disposed beneath the chuck, the base including a second hole through the base, and the second hole communicating with the first hole;
a first cylindrical liner disposed in the second hole, the first cylindrical liner having a relative permittivity of 5 or less;
an edge ring surrounding the first mounting portion; and
a second cylindrical liner having a relative permittivity of 5 or less,
wherein the base includes a second mounting portion for the edge ring and a third hole through the second mounting portion, and
wherein the second cylindrical liner is disposed in the third hole.

16. A stage to be disposed in a chamber of a plasma processing apparatus, the stage comprising:
a chuck including a first mounting portion for a substrate and a first hole through the first mounting portion;
a base disposed beneath the chuck, the base including a second hole through the base, and the second hole communicating with the first hole;
a first cylindrical liner disposed in the second hole, the first cylindrical liner having a relative permittivity of 5 or less;
an edge ring surrounding the first mounting portion; and
a second cylindrical liner having a relative permittivity of 5 or less,
wherein the chuck includes a second mounting portion for the edge ring and a third hole through the second mounting portion,
wherein the base includes a fourth hole through the base, the fourth hole communicating with the third hole, and
wherein the second cylindrical liner is disposed in the fourth hole.

17. The stage according to claim 16, wherein the second cylindrical liner is formed of a fluorine-containing material.

18. The stage according to claim 16, further comprising a second sleeve between the second cylindrical liner and the base, the second sleeve having a higher relative permittivity than the second cylindrical liner.

19. The stage according to claim 18, wherein a space to be depressurized for plasma processing is provided between the second cylindrical liner and the second sleeve.

* * * * *